(12) United States Patent
Pang

(10) Patent No.: US 7,683,425 B2
(45) Date of Patent: Mar. 23, 2010

(54) TRENCH GATE-TYPE MOSFET DEVICE AND METHOD FOR MANUFACTURING THE SAME

(75) Inventor: Sung Man Pang, Gwangmyeong-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 99 days.

(21) Appl. No.: 11/930,383

(22) Filed: Oct. 31, 2007

(65) Prior Publication Data

US 2008/0157192 A1    Jul. 3, 2008

(30) Foreign Application Priority Data

Dec. 27, 2006  (KR) ...................... 10-2006-0134452

(51) Int. Cl.
*H01L 29/78*  (2006.01)

(52) U.S. Cl. ................ 257/334; 257/E29.262; 438/270

(58) Field of Classification Search ................. 257/334, 257/E29.262, E21.41; 438/270
See application file for complete search history.

(56) References Cited

U.S. PATENT DOCUMENTS

2004/0262677 A1  12/2004  Harada

2007/0059887 A1 *  3/2007  Poelzl et al. ................ 438/270

FOREIGN PATENT DOCUMENTS

KR    10-2002-23415    3/2002

OTHER PUBLICATIONS

Office Action received from the Korean Patent Office on Dec. 18, 2007, in corresponding Application No. 10-2006-0134452 (4 pages).
English Translation of the First Office Action issued by the Chinese Patent Office on Jul. 24, 2009, in corresponding Application No. 200710181599.3 (2 pages).

* cited by examiner

*Primary Examiner*—Thomas L Dickey
*Assistant Examiner*—Fazli Erdem
(74) *Attorney, Agent, or Firm*—Finnegan, Henderson, Farabow, Garrett & Dunner, L.L.P.

(57) ABSTRACT

A semiconductor device includes a first conduction type semiconductor substrate, a second conduction type base region in the substrate, a high concentration first conduction type source region in the base region, and first and second trenches. The source region is formed in an opposite side of the substrate. The first and second trenches pass through the source region and the base region, and the first and second trenches have different widths and shapes, respectively.

13 Claims, 2 Drawing Sheets

TRENCH GATE-TYPE MOSFET DEVICE AND METHOD FOR MANUFACTURING THE SAME

This application is based upon and claims the benefit of priority to Korean Patent Application No. 10-2006-0134452 (filed on Dec. 27, 2006), the entire contents of which are incorporated herein by reference.

TECHNICAL FIELD

Embodiments relate to a trench gate-type MOSFET device and a method for manufacturing the same.

BACKGROUND

A metal oxide semiconductor field effect transistor (MOSFET) has high input impedance and thus has a very simple gate driving circuit compared to a bipolar transistor. Thus, it may have an advantage in that there is no time delay caused by accumulation or recombination of minority carriers while the device is turned-off because the MOSFET is a unipolar device.

The MOSFET is used for a switching mode power supply, a lamp ballast, and a motor driving circuit. A drain extended MOSFET structure using planar diffusion technology has been used for a MOSFET for power.

A trench gate-type MOSFET structure formed by etching a semiconductor substrate to a predetermined depth to form a trench, and filling the trench with a gate conductive layer is under study. The trench gate-type MOSFET increases cell density per unit cell, and decreases the resistance of a junction FET (JFET) between devices, thereby realizing high integration and small source-drain-on resistance Rds (on).

A trench forming a cell of the trench gate type MOSFET has a stripe shape or a cross shape. In a stripe-shaped trench gate, an N+ source region (or P+ source region) and a P type body region (or an N type body region) are connected to each other along the sidewall of the trench.

In a stripe-shaped trench structure, a voltage applied to a source region and a body region is uniformly distributed along the trench. However, since density of cell is low compared to a cross type trench structure, on-resistance may be large.

In a cross-shaped trench structure, an N+ source region (or P+ source region) and a P-type body region (or N type body region) are isolated in the trench, so that they are electrically connected to each other by only a contact material between the source and the body. In the trench gate-type MOSFET, density of a cell is important to secure a large region where a drain current flows per unit area.

SUMMARY

Disclosed is a trench gate-type MOSFET device and a method of manufacturing the same, having a structure that can increase density of a cell in a trench gate MOSFET.

Embodiments also provide a semiconductor device and a method of manufacturing the same, wherein a source region and a body region can be connected to each other along a sidewall of a trench in a trench gate MOSFET.

In a semiconductor device including an epitaxial layer gate of a trench structure and source regions according to an embodiment, the trench structure includes a plurality of trenches alternately arranged and having different widths, respectively.

In one embodiment, a semiconductor device includes a first conduction-type semiconductor substrate; a second conduction-type base region in the substrate; a high-concentration first conduction-type source region in the base region, the source region being in an opposite side of the substrate; and first and second trenches passing through the source region and the base region, the first and second trenches having different widths and shapes, respectively.

In another embodiment, a method of manufacturing a semiconductor device is provided, comprising selectively implanting second conduction-type impurities into a first conduction-type semiconductor substrate to form a second conduction-type base region having a predetermined depth in the substrate; forming a high-concentration first conduction-type source region in a surface of the base region that is opposite to the substrate; and forming first and second trenches passing through the source region and the base region and having different widths and shapes, respectively.

According to an embodiment, density of a cell may be increased and on-resistance Rds-on may be decreased in a MOSFET device having a trench gate, so that electrical characteristics can be enhanced.

The details of one or more embodiments are set forth in the accompanying drawings and the description below. Other features will be apparent from the description and drawings, and from the claims.

DETAILED DESCRIPTION

Figure 1:
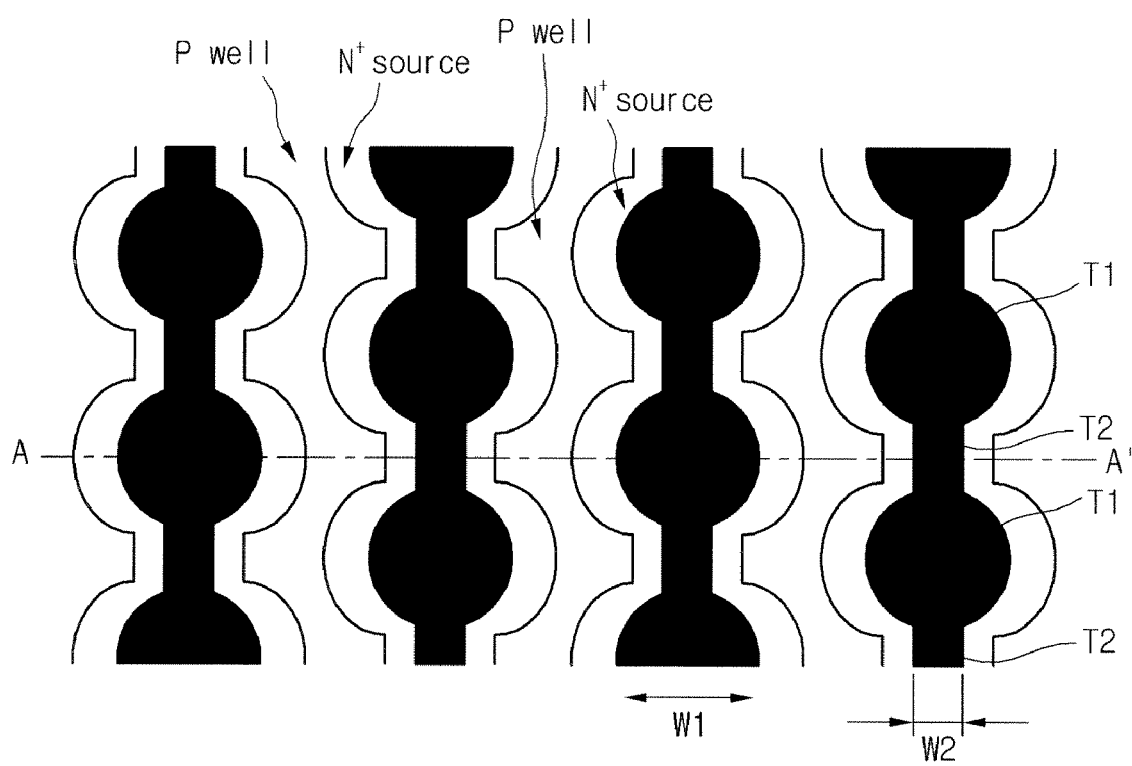
FIG. 1 is a plan view illustrating a semiconductor device consistent with the invention.

Reference will now be made in detail to the embodiments of the present disclosure, examples of which are illustrated in the accompanying drawings. In the drawings, like reference numerals denote like elements. In descriptions of embodiments, detail descriptions of known functions or constructions are omitted so that they may not obscure the spirit of the embodiments.

Also, in the descriptions of embodiments, it will be understood that when a layer (or film) is referred to as being 'on/above/over/upper' another layer or substrate, it can be directly on the another layer or substrate, or intervening layers may also be present. Further, it will be understood that when a layer is referred to as being 'under/below/under/lower' another layer, it can be directly under the another layer, and one or more intervening layers may also be present. Therefore, meaning thereof should be judged according to the spirit of the present disclosure.

Figure 2:
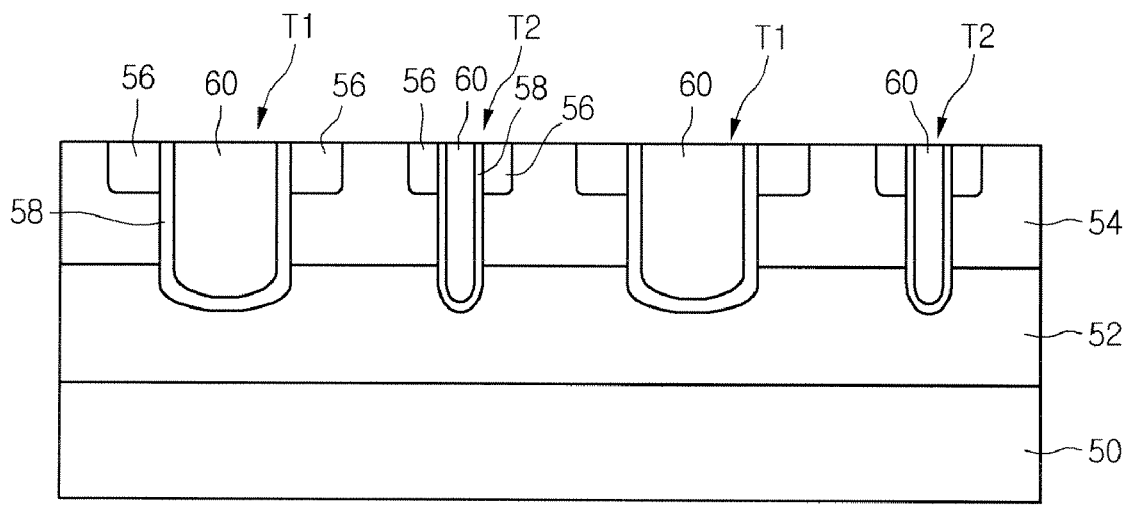
FIG. 2 is a cross-sectional view taken along the line A-A' of FIG. 1.

FIG. 1 is a plan view illustrating a semiconductor device according to an embodiment, and FIG. 2 is a cross-sectional view taken along the line A-A' of FIG. 1.

Referring to FIGS. 1 and 2, a low-concentration N-type epitaxial layer 52 is formed on a high-concentration first conduction-type substrate, for example, an N-type substrate 50. A low-concentration second conduction-type base region, for example, a P type base region 54, is formed inside the epitaxial layer 52. A high concentration N type source region 56 is formed inside the base region 54. A first trench T1 and a second trench T2 are formed to a predetermined depth in a portion of the surface of the epitaxial layer 52 on one side.

The first and second trenches T1 and T2 are formed to have different widths W and shapes, respectively. For example, the first trench T1 can be formed in a cylindrical shape of a diameter greater than that of the second trench T2. The second trench T2 can be formed in a quadrangular prism shape having a length smaller than the diameter of the first trench T1.

The first and second trenches are alternately and periodically arranged. In an embodiment consistent with the invention, all of first trenches T1 have the same width W1, and all of second trenches T2 have the same width W2.

In another embodiment, the first and second trenches T1 and T2 are arranged alternately one by one. However, two or more first and second trenches T1 and T2 can be successively and alternately arranged.

In yet another embodiment, the first trench T1 has the width W1 different from the width W2 of the second trench T2. The first and second trenches T1 and T2 can be formed in different shapes and arranged alternately. Here, a term 'width' is used for convenience in description, and a term 'length' can be used to have the same meaning. The first and second trenches T1 and T2 are connected to each other and arranged alternately and continuously.

A gate oxide layer 58 is formed on the surfaces of the first and second trenches T1 and T2. A gate conducting layer 60 is formed on the gate oxide layer 58 to fill the first and second trenches T1 and T2.

An interlayer insulating layer is formed on the gate conducting layer 60. A source contact and a gate contact are formed in the interlayer insulating layer. A gate line layer and a source line layer are formed on the interlayer insulating layer. The gate line layer is electrically connected to the gate conducting layer via the gate contact, and the source line layer is electrically connected to the source region via the source contact.

As described above, the trenches of the MOSFECT are formed in a different width (or length) and shape as illustrated in FIGS. 1 and 2, so that a trench structure where the trenches are connected to each other is formed. Therefore, a drain current flows in a vertical direction relative to the device. When a current flows along the trench, that is, the surface of a cylindrical shape, the vertical cross-sectional area of a channel is widened in comparison with a stripe-shaped trench. Therefore, the trench structure can have greater channel density than that of the stripe-shaped trench in a device of the same size.

A method of manufacturing a semiconductor device, consistent with the invention, will be described below.

Figure 3:
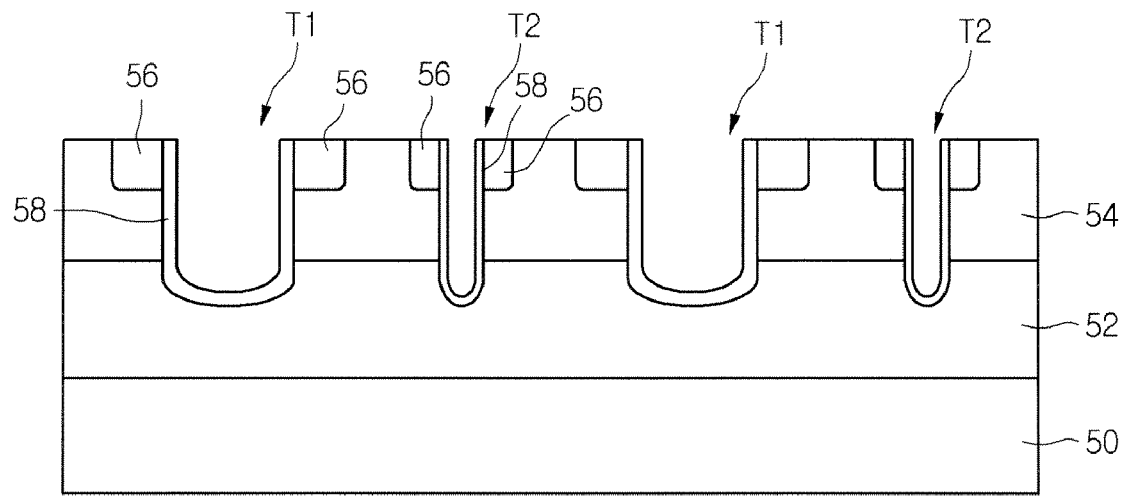
FIGS. 3 and 4 are views explaining a method of manufacturing a semiconductor device consistent with the invention.

Referring to FIG. 3, a low concentration N type epitaxial layer 52 is formed on a high concentration first conduction type substrate, for example, an N type semiconductor substrate 50. A second conduction type base region is formed inside the epitaxial layer 52. For example, P type impurities and first conduction type impurities are selectively implanted and annealed to form a second conduction type base region 54 having a predetermined depth in the surface of the epitaxial layer 52 that is opposite to the substrate. A high concentration first conduction type source region 56 is formed in the surface of the base region 54.

A mask (not shown) where a trench structure pattern, that is, a first trench pattern and a second trench pattern have been formed as illustrated in FIG. 1 is formed on the resulting structure where the source region 56 has been formed. A first trench T1 and a second trench T2 passing through the source region 56 and the base region 54 are formed through a trench etching process using this mask as an etch mask.

Subsequently, a gate oxide layer 58 is formed on the surfaces of the first and second trenches T1 and T2. The gate oxide layer 58 is a gate insulating layer. A sacrificial oxidation process can be performed to recover the surfaces of the trenches damaged by the trench etching process after the trenches T1 and T2 are formed.

Figure 4:
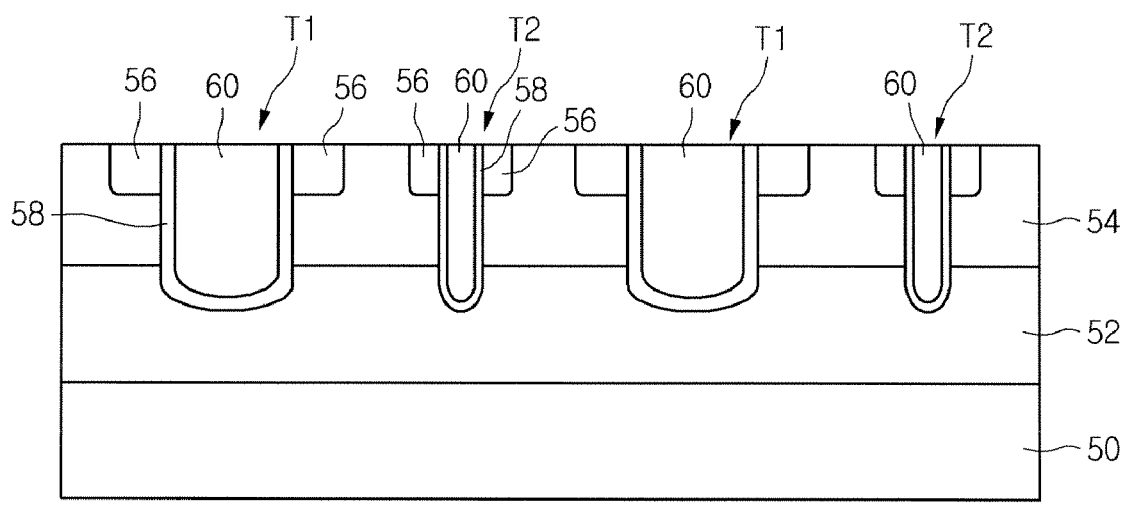

Next, referring to FIG. 4, a conducting layer, for example, a polysilicon layer doped with impurities is formed on the resulting structure where the gate oxide layer 58 has been formed, and then patterned to form a gate conducting layer 60 filling the trenches T1 and T2.

Next, an insulating material is deposited on the front side of the resulting structure where the gate conducting layer 60 has been formed, and then patterned to an interlayer insulating layer including a source contact and a gate contact. A conducting material, for example, metal is deposited on the front side of the resulting structure where the interlayer insulating layer has been formed, and then patterned to form a gate line layer electrically connected to the gate conducting layer 60 via the gate contact, and to form a source line layer electrically connected to the source region 56 and the base region 54 via the source contact.

According to an embodiment, since the trenches of the MOSFET are formed in different widths (or lengths) and shapes, respectively, to form a trench structure where the trenches are connected to each other, a drain current flows in a vertical direction of the device. When a current flows along the surface of a cylindrical trench, the vertical cross-sectional area of a channel is widened in comparison with a stripe-shaped trench. Therefore, the trench structure can have greater channel density than that of the stripe-shaped trench in a device of the same size, and thus electrical characteristics of the device improves.

Any reference in this specification to "one embodiment," "an embodiment," "example embodiment," etc., means that a particular feature, structure, or characteristic described in connection with the embodiment is included in at least one embodiment consistent with the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although a number of illustrative embodiments, consistent with the invention have been described, it should be understood that numerous other modifications and embodiments can be devised by those skilled in the art that will fall within the spirit and scope of the principles of this disclosure. More particularly, a number of variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor device comprising:
   a first conduction type semiconductor substrate;
   a second conduction type base region in the substrate;

a high concentration first conduction type source region in the base region, the source region being in an opposite side of the substrate; and first and second trenches passing through the source region and the base region, respectively, the first and second trenches having different widths and shapes; wherein the first trench has a cylindrical shape, the second trench has a quadrangular shape, and the first and second trenches are alternately arranged.

2. The device according to claim 1, wherein the first trench has a diameter greater than that of the second trench.

3. The device according to claim 1, wherein the second trench has a length smaller than a diameter of the first trench.

4. A method of manufacturing a semiconductor device, comprising:

selectively implanting second conduction type impurities into a first conduction type semiconductor substrate to form a second conduction type base region having a predetermined depth in the substrate;

forming a high concentration first conduction type source region in a surface of the base region that is opposite to the substrate; and forming first and second trenches passing through the source region and the base region, respectively, and having different widths and shapes; wherein the first trench has a cylindrical shape, the second trench has a quadrangular shape, and the first and second trenches are alternately arranged.

5. The method according to claim 4, wherein the first trench has a diameter greater than that of the second trench.

6. The method according to claim 4, wherein the second trench has a length smaller than a diameter of the first trench.

7. A semiconductor device comprising:
a substrate;
an epitaxial layer;
a gate and a source region;
the gate comprising a plurality of trenches alternately arranged and having different widths, wherein the plurality of trenches comprise a first trench having a cylindrical shape and a second trench having a quadrangular shape.

8. The device according to claim 7, wherein the trenches comprise at least one of a cylindrical first trench and a quadrangular second trench, and a width of the first trench is greater than that of the second trench.

9. The device according to claim 7, wherein the trenches comprise a plurality of trenches having different widths, the trenches being successively arranged.

10. The device according to claim 7, wherein the trenches comprise a plurality of trenches adjacent to each other.

11. The device according to claim 7, wherein the trenches comprise two trenches having different widths, and alternately arranged one by one.

12. The device according to claim 7, wherein the trenches comprise a plurality of trenches having different widths, with respect to both a horizontal direction and a vertical direction.

13. The device according to claim 7, wherein the plurality of trenches having different widths, are connected to each other.

* * * * *